(12) United States Patent
Tsuda

(10) Patent No.: US 9,599,659 B2
(45) Date of Patent: Mar. 21, 2017

(54) INSPECTION DEVICE

(71) Applicant: Keiji Tsuda, Hyogo (JP)

(72) Inventor: Keiji Tsuda, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 14/722,746

(22) Filed: May 27, 2015

(65) Prior Publication Data
US 2015/0355100 A1 Dec. 10, 2015

(30) Foreign Application Priority Data

Jun. 6, 2014 (JP) .................................. 2014-117487

(51) Int. Cl.
G01N 21/00 (2006.01)
G01R 31/26 (2014.01)
G01J 1/02 (2006.01)
G01J 1/42 (2006.01)

(52) U.S. Cl.
CPC ........ G01R 31/2635 (2013.01); G01J 1/0271 (2013.01); G01J 1/42 (2013.01); G01J 2001/4252 (2013.01)

(58) Field of Classification Search
CPC ..... H01L 33/00; H01L 33/0095; H01L 33/60; G01N 21/88; G01R 31/26; G01R 31/2635; G01J 1/0422; G01J 2001/4247; G01J 1/4257
USPC ............................ 356/237.2–237.6, 614–624
See application file for complete search history.

(56) References Cited

U.S. PATENT DOCUMENTS

| | | | | |
|---|---|---|---|---|
| 3,467,802 A | * | 9/1969 | Martin | ................. H01H 13/023 200/314 |
| 3,713,074 A | * | 1/1973 | Pasbrig | .............. H01R 13/4532 439/137 |
| 5,078,491 A | * | 1/1992 | Johnston, Jr. | ......... G01J 1/4257 356/121 |
| 5,100,231 A | * | 3/1992 | Sasnett | ................. G01J 1/4257 356/121 |

(Continued)

FOREIGN PATENT DOCUMENTS

| | | |
|---|---|---|
| JP | 11-258290 | 9/1999 |
| JP | 2011-179872 | 9/2011 |
| WO | WO 2012/073357 A1 | 6/2012 |

Primary Examiner — Tarifur Chowdhury
Assistant Examiner — Isiaka Akanbi
(74) Attorney, Agent, or Firm — Oblon, McClelland, Maier & Neustadt, L.L.P.

(57) ABSTRACT

An inspection device is provided including a light emitting element configured to emit light, a light receiving element arranged so as to face the light emitting element and configured to receive the light, where one of the light emitting element and the light receiving element is used as a to-be-inspected element, and the other one of the light emitting element and the light receiving element is used as an inspection element that inspects the to-be-inspected element, a housing configured to accommodate the inspection element, and a lid configured to be detachable from the housing. In the inspection device, one of the housing and the lid is provided with an arrangement unit to which the to-be-inspected element is set in a detachable manner, and the lid includes a contact unit that electrically contacts the to-be-inspected element by touching and detaching from the to-be-inspected element.

20 Claims, 5 Drawing Sheets

(56) References Cited

U.S. PATENT DOCUMENTS

| | | | | |
|---|---|---|---|---|
| 5,778,127 A * | 7/1998 | Gilliland | .............. | G02B 6/4204 |
| | | | | 385/92 |
| 5,867,259 A * | 2/1999 | Yanagi | ............... | G01M 11/0214 |
| | | | | 356/124 |
| 2002/0197025 A1* | 12/2002 | Vaganov | ................ | G02B 6/423 |
| | | | | 385/92 |
| 2003/0058455 A1* | 3/2003 | Ebihara | ............... | G01B 11/007 |
| | | | | 356/601 |
| 2005/0283068 A1* | 12/2005 | Zuccolotto | ........... | A61B 5/0555 |
| | | | | 600/410 |
| 2012/0312973 A1* | 12/2012 | D'Costa | ................ | G01N 21/53 |
| | | | | 250/239 |
| 2013/0266261 A1* | 10/2013 | Lam | ........................ | G02B 6/32 |
| | | | | 385/33 |
| 2013/0279853 A1* | 10/2013 | Lam | ........................ | G02B 6/32 |
| | | | | 385/33 |
| 2015/0111287 A1* | 4/2015 | Rawle | ...................... | B01L 7/52 |
| | | | | 435/287.2 |

* cited by examiner

INSPECTION DEVICE

CROSS-REFERENCE TO RELATED APPLICATION

This patent application is based on and claims priority pursuant to 35 U.S.C. §119(a) to Japanese Patent Application No. 2014-117487, filed on Jun. 6, 2014, in the Japan Patent Office, the entire disclosure of which is hereby incorporated by reference herein.

BACKGROUND

Technical Field

Example embodiments of the present invention relate to an inspection device.

Background Art

Light receiving elements (also called photodetectors) such as phototransistor integrated circuits (IC) or light emitting elements such as light-emitting diodes (LED) and laser diodes (LD) are mass-produced, and the product includes some defective items.

For this reason, it is necessary to conduct so-called final test and inspection in order to check the quality of the products and sort quality products that satisfy the rating.

SUMMARY

Embodiments of the present invention described herein provide an inspection device including a light emitting element configured to emit light, a light receiving element arranged so as to face the light emitting element and configured to receive the light, where one of the light emitting element and the light receiving element is used as a to-be-inspected element, and the other one of the light emitting element and the light receiving element is used as an inspection element that inspects the to-be-inspected element, a housing configured to accommodate the inspection element, and a lid configured to be detachable from the housing. In the inspection device, one of the housing and the lid is provided with an arrangement unit to which the to-be-inspected element is set in a detachable manner, and the lid includes a contact unit that electrically contacts the to-be-inspected element by touching and detaching from the to-be-inspected element.

BRIEF DESCRIPTION OF THE DRAWINGS

A more complete appreciation of exemplary embodiments and the many attendant advantages thereof will be readily obtained as the same becomes better understood by reference to the following detailed description when considered in connection with the accompanying drawings.

Figure 1:
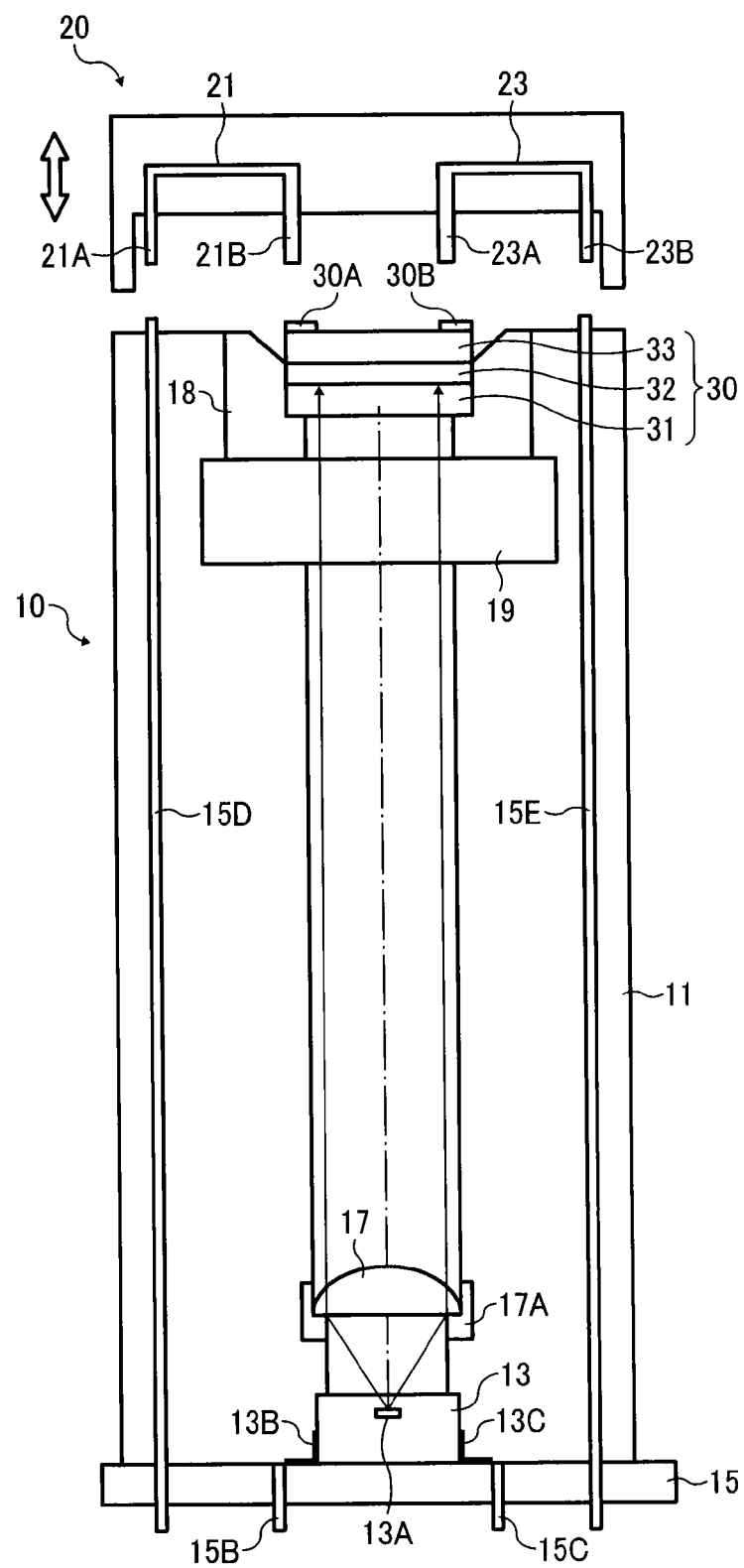
FIG. 1 is a schematic diagram of an inspection device according to an example embodiment of the present invention.

The accompanying drawings are intended to depict exemplary embodiments of the present disclosure and should not be interpreted to limit the scope thereof. The accompanying drawings are not to be considered as drawn to scale unless explicitly noted.

DETAILED DESCRIPTION

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments shown in the drawings, specific terminology is employed for the sake of clarity. However, the present disclosure is not intended to be limited to the specific terminology so selected and it is to be understood that each specific element includes all technical equivalents that have the same structure, operate in a similar manner, and achieve a similar result.

Example embodiments of the present invention will be described below. FIG. 1 is a schematic diagram of an inspection device according to an example embodiment of the present invention. In the inspection device according to the present example embodiment, a light emitting element and light receiving element are referred to as an "inspection element" and "to-be-inspected element", respectively, and a light receiving element (to-be-inspected element) is inspected.

In the following description of FIG. 1, expression such as upper part and lower part is used with reference to the up-and-down directions of FIG. 1.

Note that such an upper part and lower part are used for the sake of explanatory convenience, and they do not always match the up-and-down directions in reality.

In other words, the spatial arrangement of the inspection device may vary in any of the up-and-down and right-and-left directions, the vertical directions, and the oblique directions when inspection is actually performed.

In FIG. 1, reference sign 10 indicates a housing, and reference sign 20 indicates a lid. More specifically, the housing 10 is arranged at a lower part, and the lid 20 is arranged at an upper part.

The housing 10 has a tubular body 11 that is formed in a tubular shape by electrically-insulative resin, and a light emitting element 13 that serves as an inspection element is fixed to an edge of the tubular body 11 at a lower part.

The light emitting element 13 is a surface-mounted light-emitting diode (LED) (i.e., surface-mounted device (SMD) LED) in the present example embodiment, and the light-emission wavelength is 860 nm.

In the following description of an example embodiment of FIG. 1, reference sign 13 is used for the inspection element, the light emitting element, and the SMD LED in common.

In other words, the light emitting element 13 serves as the inspection element 13 in inspection, and for example, the SMD LED 13 is used as the light emitting element 13.

The SMD LED 13 is mounted on a printed wiring board 15.

In the following description, the printed wiring board is abbreviated to PWB. The PWB 15 on which the SMD LED 13 is mounted is integrated with the tubular body 11 at a lower part of the housing 10, and forms the bottom of the tubular body 11.

A light-emitting unit 13A of the SMD LED 13 is sealed in the casing, and terminals 13B and 13C that are drawn outside of the casing are electrically connected to electrically-conductive contact units 15B and 15C formed on the PWB 15.

Moreover, electrically-conductive contact units 15D and 15E are provided for the PWB 15.

As illustrated in FIG. 1, the contact units 15D and 15E penetrate the tubular body 11 in the axial direction of the tube (i.e., the up-and-down directions of FIG. 1), and ends of the contact units 15D and 15E are exposed at the end surface of the tubular body 11 at an upper part.

In the axial direction of the tubular body 11, a lens holder 17A is fixed at a position above with prescribed distance from the light-emitting unit 13A of the SMD LED 13.

A coupling lens 17 is held by the lens holder 17A.

An arrangement unit 18 is provided at an upper edge of the tubular body 11 in a fixed manner, and a neutral-density (ND) filter 19 is fixed in proximity to the arrangement unit 18.

The arrangement unit 18 is a part to which a to-be-inspected element is set when inspection is performed, and FIG. 1 illustrates a state in which the to-be-inspected element 30 is set to a fixed position of the arrangement unit 18.

In other words, the to-be-inspected element 30 is set to the arrangement unit 18 in a detachable manner.

In the present example embodiment, the to-be-inspected element 30 that serves as a light receiving element is a phototransistor integrated circuit (IC).

In the following description, reference sign 30 is used for the light receiving element, the to-be-inspected element, and the phototransistor IC in common.

In other words, the light receiving element 30 serves as the to-be-inspected element 30 in inspection, and for example, the phototransistor IC is used as the light receiving element 30.

The phototransistor IC 30 includes a transparent cover 31, a photosensor 32, and a substrate 33, and the center of the surface of the photosensor 32 serves as a photo-sensing surface.

The photosensor 32 includes the chip and circuit of the phototransistor, and they are fixed to the substrate 33 by performing die bonding and then performing wire bonding. Note that the photosensor 32 is sealed by the transparent cover 31 that is made of transparent resin.

In FIG. 1, reference signs 30A and 30B indicate the two terminals drawn from the photosensor 32.

The lid 20 is detachable from the upper edge of the tubular body 11.

The principal part of the lid 20 is made of resin that is electrically insulative.

The lid 20 includes contact units 21 and 23 that are electrically conductive. Note that the both ends of each of the contact units 21 and 23 are exposed from the surface at a lower part of the lid 20.

As illustrated in FIG. 1, upon setting the to-be-inspected element 30 to the arrangement unit 18, the lid 20 is displaced towards the top end of the tubular body 11, such that the end 21A of the contact unit 21 contacts the upper end of the contact unit 15D that penetrates the tubular body 11.

Moreover, the lid 20 is displaced such that an end 21B contacts the terminal 30A of the to-be-inspected element 30. In a similar manner, the lid 20 is displaced such that the end 23B of the contact unit 23 contacts the upper end of the contact unit 15E that penetrates the tubular body 11, and an end 23A contacts the terminal 30B of the to-be-inspected element 30.

As described above, the terminals 30A and 30B of the to-be-inspected element 30 electrically contact the contact units 15D and 15E on the tubular body 11 side, through the contact units 21 and 23 provided for the lid 20.

As described above, when the lid 20 is closed, the terminals 30A and 30B of the to-be-inspected element 30 electrically contact the contact units 15D and 15E on the tubular body 11 side.

In other words, in the inspection device according to the present example embodiment as illustrated in FIG. 1, one of the light emitting element and the light receiving element is used as the to-be-inspected element 30, and the other one is used as the inspection element 13, where the to-be-inspected element 30 and the inspection element 13 are arranged so as to be opposed to each other and the to-be-inspected element 30 is inspected thereby.

The inspection device according to the present example embodiment includes the housing 10 that holds the inspection element 13, and the lid 20 that is detachable from the housing 10.

The arrangement unit 18 to which the to-be-inspected element 30 is set in a detachable manner is arranged in the housing 10, and the lid 20 includes the contact units 21 and 23 that electrically contact the to-be-inspected element 30 by touching and detaching from the to-be-inspected element 30.

When inspection is performed, the lid 20 is fixed to the housing 10 by any desired engaging unit.

When the lid 20 is closed, the terminals 30A and 30B of the to-be-inspected element 30 are electrically connected to the contact units 15D and 15E on the housing 10 side, through the contact units 21 and 23 of the lid 20.

Voltage for inspection is applied to between the contact units 15D and 15E that are exposed at the bottom surface of the PWB 15, and voltage for light emission is applied to between contact units 15B and 15C.

When the light-emitting unit 13A of the inspection element 13 emits light due to the voltage for light emission, the to-be-inspected element 30 receives the light emitted from the light-emitting unit 13A and generates photoelectric current.

The photoelectric current is converted into voltage and is amplified by a prescribed amplification factor to generate voltage for inspection. Then, a change in the voltage for inspection is measured. Whether or not the change in the voltage for inspection is appropriate is determined to see if the to-be-inspected element 30 satisfies the rating. In other words, the quality of the to-be-inspected element 30 can be checked.

In the inspection device according to the present embodiment, one of the light emitting element and the light receiving element is used as a to-be-inspected element and the other one is used as an inspection element, and the to-be-inspected element and the inspection element are arranged so as to be opposed to each other and the to-be-inspected element is inspected thereby.

In the example embodiment described above, a light receiving element (phototransistor IC) is used as the to-be-inspected element 30, and a light emitting element (SMD LED) is used as the inspection element 13, in performing inspection.

In the example embodiment described above with reference to FIG. 1, the housing 10 has the light emitting element 13 that serves as an inspection element, and the to-be-inspected element 30 is set to the housing 10 in a detachable manner.

Moreover, the lid 20 includes the contact units 21 and 23 that electrically contact the to-be-inspected element 30 by touching and detaching from the to-be-inspected element 30.

When inspection is performed, the photo-sensing surface of the light receiving element of the to-be-inspected element 30 is opposed to the light-emitting unit 13A of the light emitting element 13 that serves as an inspection element.

The relationship between the to-be-inspected element and the inspection element may be reversed with reference to the example embodiment descried above. That is, a light receiving element and a light emitting element may be used as the inspection element and the to-be-inspected element, respectively, in performing inspection.

More specifically, the light receiving element that serves as an inspection element is arranged on the housing side, and the light emitting element that serves as a to-be-inspected element is arranged so as to be opposed to the light receiving element.

Then, the quality of the light emitting element can be checked by determining whether the light emission of the light emitting element based on the output of the light receiving element satisfies the rating.

The inspection element and the to-be-inspected element may be arranged so as to be directly opposed to each other.

In the example embodiment described above with reference to FIG. 1, the contact units 21 and 23, which electrically contacts the to-be-inspected element 30 by touching and detaching from the to-be-inspected element 30, is connected to the side of the power source through the contact units 15D and 15E that are provided for the housing 10.

In other words, the PWB 15 further includes a contact unit or circuit other than the contact units 15D and 15E.

The contact units 21 and 23, which electrically contact the to-be-inspected element 30 by touching and detaching from the to-be-inspected element 30, is connected to the side of the power source including such a contact unit or circuit, through the contact units 15D and 15E.

However, no limitation is intended thereby, and the contact units that electrically contact the to-be-inspected element 30 by touching and detaching from the to-be-inspected element 30 may be directly connected to the side of the power source from the lid.

In the example embodiment described above with reference to FIG. 1, the to-be-inspected element 30 is set to the housing 10 in a detachable manner. However, no limitation is indicated thereby, and a to-be-inspected element may be set to the lid in a detachable manner.

In such cases, the contact units of the lid is electrically connected to the to-be-inspected element by touching and detaching from the to-be-inspected element as the to-be-inspected element is set and removed therefrom.

Return to the example embodiment of FIG. 1. When the light receiving element that serves as the to-be-inspected element 30 is set to the arrangement unit 18, the space between the light emitting element 13 that serves as an inspection element and the photosensor 32 of the light receiving element 30 that serves as a to-be-inspected element is shielded from light by the housing 10.

Accordingly, the extraneous light does not affect the inspection as a noise, and inspection can stably be performed.

Moreover, fixed relative positions of the to-be-inspected element and the inspection element are achieved when inspection is performed, and inspection can always be performed under the same conditions.

When the to-be-inspected element is set to the lid, the space between the to-be-inspected element and the inspection element is shielded from light by both the lid and the housing when inspection is performed.

The inspection device according to the example embodiment as illustrated in FIG. 1 includes the coupling lens 17 and the ND filter 19.

The coupling lens 17 and the ND filter 19 are described below in detail. As described above, in the example embodiment of FIG. 1, the light emitting element that serves as the inspection element 13 is an SMD LED.

As known in the art, an LED emits a dispersed laser-beam bundle with intensity distribution of light emission according to Lambert's law.

The coupling lens 17 is used to suppress the divergence of such a dispersed laser-beam bundle.

In other words, the relative positions of the light-emitting unit 13A of the SMD LED 13 and the coupling lens 17 are arranged such that the light-emitting unit 13A is at a focal point on the object side of the coupling lens 17 that has a positive power.

Assuming that the light-emitting unit 13A is a point source of light, the light that is emitted and dispersed from the light-emitting unit 13A and then enters the coupling lens 17 heads for the to-be-inspected element side as a collimated laser-beam bundle.

Then, the light passes through the ND filter 19, and enters the photo-sensing surface of the photosensor 32 of the light receiving element 30 that serves as a to-be-inspected element. The photo-sensing surface is orthogonal to the optical axis of the coupling lens 17.

As described above, the dispersed laser-beam bundle that is emitted from the SMD LED that serves as the light emitting element 13 has an angular distribution according to Lambert's law.

For this reason, the laser-beam bundle that is emitted from the light-emitting unit 13A and then enters the coupling lens 17 has an approximately constant light intensity, and when the light is collimated, the light intensity distribution on a cross section of the laser-beam bundle is approximately even.

The ND filter 19 lets the light pass through upon attenuating the light intensity distribution of the collimated laser-beam bundle.

The laser-beam bundle that has passed through the ND filter 19 irradiates the photo-sensing surface of the light receiving element 30 in an approximately uniform manner. When the laser-beam bundle that irradiates the photo-sensing surface of the light receiving element 30 is a collimated laser-beam bundle with approximately uniform light intensity as above, the irradiation light intensity on the photo-sensing surface is averaged on each unit of dimension.

Accordingly, inspection can be performed in a state where the light-receptive characteristics of the to-be-inspected element 30 are stabilized.

As described above, the ND filter 19 is used to attenuate the intensity of the light that enters the to-be-inspected element 30.

Figure 2:
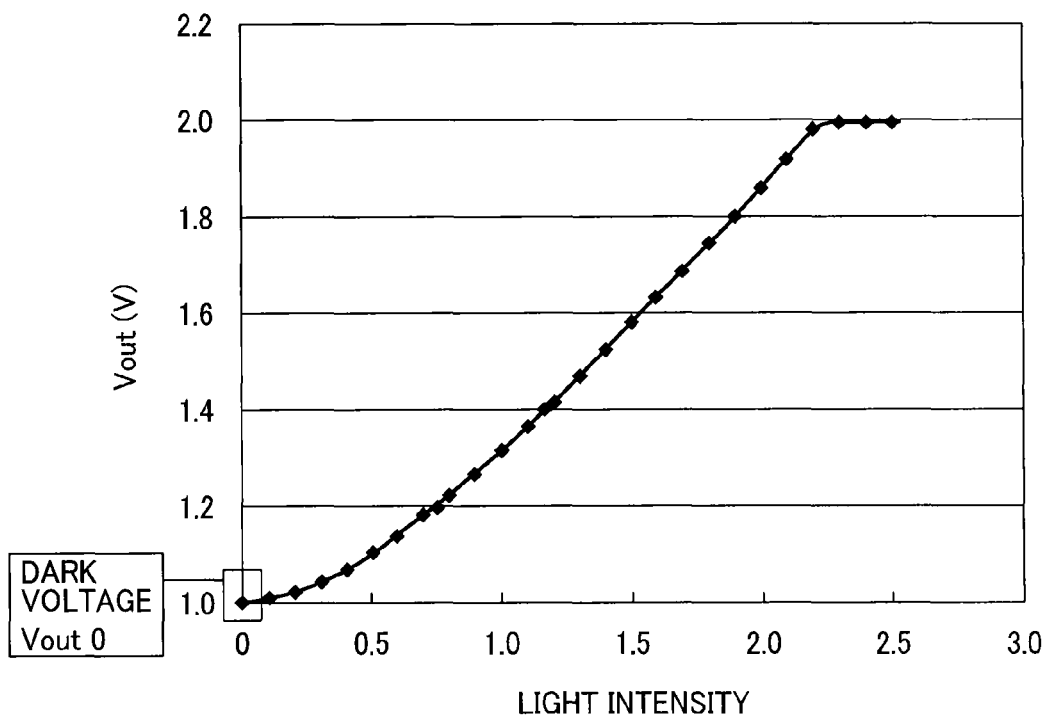
FIG. 2 illustrates the output characteristics of a light receiving element that is an example of to-be-inspected element, according to an example embodiment of the present invention.

FIG. 2 illustrates the output characteristics of the phototransistor IC that is an example of the to-be-inspected element 30, according to the present example embodiment. As described above, the to-be-inspected element 30 is a phototransistor integrated circuit (IC) in the example embodiment illustrated in FIG. 1. What is more, such a phototransistor IC has the output characteristics as illustrated in FIG. 2.

In FIG. 2, the horizontal axis indicates the light intensity (relative value), and the vertical axis indicates the light output (Vout). The light output is the voltage converted from the photoelectric current (i.e., the voltage for inspection) as described above.

As illustrated in FIG. 2, the light output monotonously increases as the light intensity increases. However, the light intensity reaches a level of saturation at a certain degree (approximately 2.2 in relative value of light intensity in FIG. 2), and no change is observed after that.

When the light intensity becomes zero in FIG. 2, the light output is dark voltage.

In the present example embodiment, the offset voltage of 1 v is applied to the phototransistor IC, and the difference between the offset voltage and the output when the light intensity is zero is the dark voltage.

In order to inspect the quality of a light receiving element, the inspection needs to be performed in a state where the light output (Vout) is not saturated.

Figure 3:
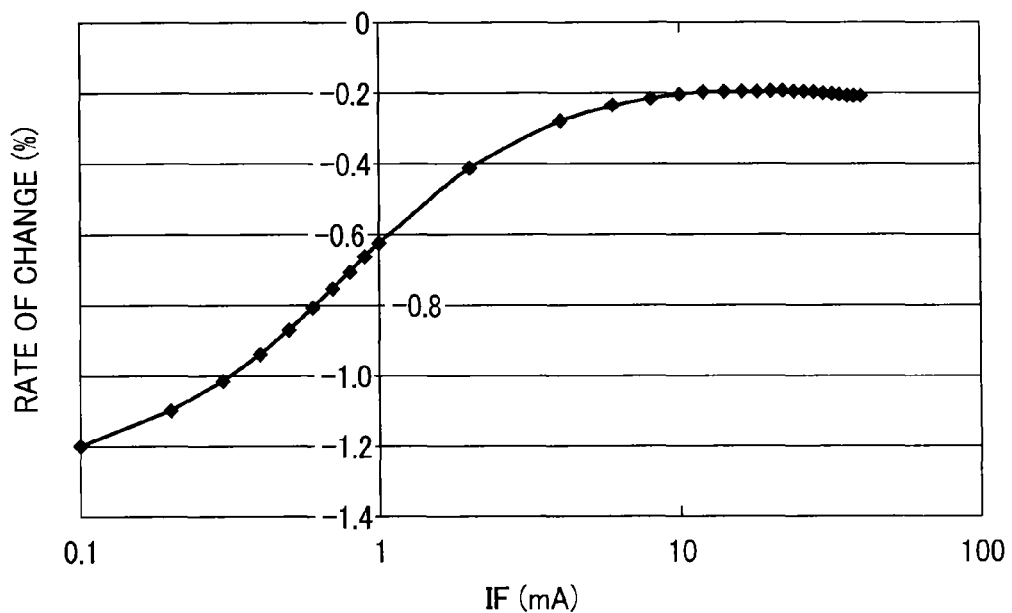
FIG. 3 illustrates the temperature characteristics of a light emitting element that is an example of to-be-inspected element, according to an example embodiment of the present invention.

FIG. 3 illustrates the temperature characteristics of the SMD LED that serves as the inspection element 13, according to the present example embodiment. In the example embodiment, the radiation intensity of an SMD LED that serves as the inspection element 13 has the temperature characteristics as illustrated in FIG. 3.

In FIG. 3, the horizontal axis indicates IF (mA) where the forward current is indicated by milliampere (mA).

In FIG. 3, the vertical axis indicates the rate of change in radiant intensity due to the temperature change.

As seen from FIG. 3, the magnitude of the temperature characteristics is greater (about −1.2%) when the forward current (IF) is smaller, and the rate of change in radiant intensity increases as the forward current increases. When the IF becomes equal to or greater than 10 mA, the rate of change in radiant intensity becomes about −0.2%, and the temperature characteristics substantially remains the same as the rate of change becomes stable with greater forward current.

For the above reasons, when a to-be-inspected element is inspected, it is desired that the light emitting element (SMD LED) 13 emit light with forward current (IF) of equal to or greater than 10 mA where the temperature characteristics are stable.

However, when the SMD LED 13 emits light with forward current (IF) equal to or greater than 10 mA, the light-emission intensity becomes too great. Accordingly, when the light that is emitted from the SMD LED 13 directly enters the to-be-inspected element 30 without the ND filter 19 in the inspection device as illustrated in FIG. 1, the light output of the to-be-inspected element 30 becomes saturated.

In order to avoid such situation, the ND filter 19 is used to attenuate the light intensity of the light that irradiates the photo-sensing surface of the to-be-inspected element 30 to a level with which the light output of the to-be-inspected element 30 is not saturated.

The transmittance of the ND filter 19 may be determined so as to satisfy a condition that the light intensity is attenuated to a level with which the light output of the to-be-inspected element is not saturated.

In other words, the transmittance of the ND filter 19 may be, for example, 10% or 0.1% as long as the condition above is satisfied.

By way of example, if the transmittance of the ND filter 19 is set to 50%, the to-be-inspected element 30 is irradiated with the laser-beam bundle emitted from the light emitting element 13 whose light intensity is attenuated by 50%.

Alternatively, the ND filter 19 whose optical density (OD) is 3.0 and average transmittance is 0.1% may be used.

As described above, the to-be-inspected element 30 is inspected in a state where the light output of the to-be-inspected element is not saturated.

Alternatively, the ND filter 19 may be omitted when the SMD LED 13 emits light with forward current (IF) of for example, about 1 mA where the light intensity of the light that directly irradiates the photo-sensing surface of the to-be-inspected element 30 does not saturate the light output of the to-be-inspected element 30.

In the example embodiment illustrated in FIG. 1, the length of the tubular body 11 of the housing 10 in the up-and-down directions is, for example, 22.8 mm.

In the example embodiment described above, it is assumed that the light-emitting unit 13A of the inspection element 13 (SMD LED) is a point source of light, and that the light that is emitted and dispersed from the light-emitting unit 13A and then enters the coupling lens 17 is transformed to a collimated laser-beam bundle.

Note that the light-emitting unit 13A of the SMD LED that serves as the inspection element 13 is not a point source of light in actuality, and has a limited dimension. Such a limited dimension is about "0.2 mm*0.2 mm".

In the example embodiment illustrated in FIG. 1, the light-emitting unit 13A is arranged at a focal point of the coupling lens 17 on the object side, and the light that is emitted from the light-emitting unit directly enters the coupling lens 17.

In such cases, a laser-beam bundle that has passed through the coupling lens 17 is not a collimated laser-beam bundle in a strict sense because the light-emitting unit 13A has a limited dimension.

This matter is described below in detail.

Figure 4:
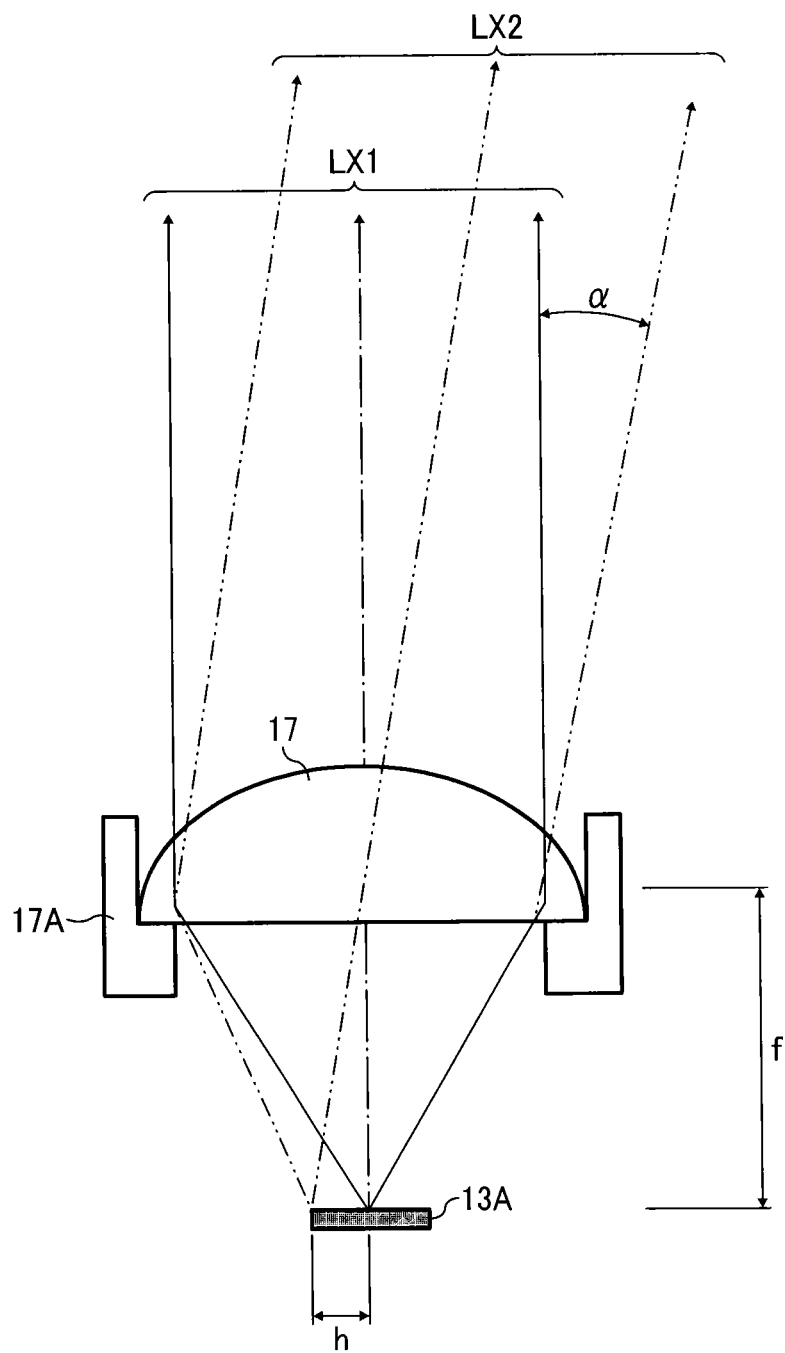
FIG. 4 illustrates the dispersion of laser-beam bundles due to a limited area of the light-emitting unit of a light emitting element, according to an example embodiment of the present invention.

FIG. 4 illustrates the dispersion of laser-beam bundles due to a limited area of the light-emitting unit 13A of the light emitting element 13, according to the present example embodiment. Among the coupling lens 17 and the light-emitting unit 13A illustrated in FIG. 4, the light-emitting unit 13A is drawn larger than actual size for the purposes of simplification.

The center of the light-emitting unit 13A is arranged on the optical axis of the coupling lens 17, and the light-emitting surface of the light-emitting unit 13A is orthogonal to the optical axis of the coupling lens 17.

The divergent laser-beam bundle that is emitted from the center of the light-emitting unit 13A is collimated by the coupling lens 17 to a collimated laser-beam bundle LX1 that is parallel to the optical axis of the coupling lens 17.

Next, a laser-beam bundle that is emitted from an edge of the light-emitting unit 13A (the distance between the center of the light-emitting unit 13A and the edge is indicated by "h" in FIG. 4) is described.

The divergent laser-beam bundle that is emitted from such an edge of the light-emitting unit 13A is collimated by the coupling lens 17 to a collimated laser-beam bundle LX2 that is oblique to the optical axis of the coupling lens 17 by the angle of "α" degrees as illustrated in FIG. 4.

The angle of "α" is referred to as angle of divergence in the following description.

The angle of divergence "α" is calculated as follows.

The focal length on the object side of the coupling lens 17 is indicated by "f" in FIG. 4.

As described above, the distance between an edge of the light-emitting unit 13A and the center of the light-emitting unit 13A is "h" as illustrated in FIG. 4.

Then, angle of divergence "α", the focal length "f", and the distance "h" satisfy the following equation.

$$\tan \alpha = h/f$$

Accordingly, angle of divergence "α" can be calculated as follows.

$$\alpha = \tan^{-1}(h/f)(>0)$$

This indicates that a laser-beam bundle that is emitted from the coupling lens 17 to a to-be-inspected element is a divergent laser-beam bundle.

Assuming that the light-emitting unit 13A is a square of "0.2 mm*0.2 mm", the minimum value for the distance "h" is 0.1 mm, and the maximum value of the distance "h" is 0.14 mm.

Accordingly, the minimum value for angle of divergence "α" is "$\tan^{-1}(0.1/f)$", and the maximum value is "$\tan^{-1}(0.14/f)$".

Accordingly, when the divergent laser-beam bundle is viewed from the optical-axis direction of the coupling lens 17, the angle of divergence "α" smoothly varies around the optical axis between the minimum value and the maximum value described above.

The laser-beam bundle with angle of divergence "α" is different from the collimated laser-beam bundle LX1 that is parallel to the optical axis of the coupling lens 17 in that the former may be reflected at the inner wall of the tubular body 11 and such reflected light enters the photo-sensing surface of the light receiving element 30 that serves as a to-be-inspected element with various incidence angles. This indicates that the laser-beam bundle with angle of divergence "α" may cause a noise in performing inspection.

It is desired that such a noise be reduced as much as possible.

In order to reduce such a noise, for example, the following measures may be taken.

As seen from the equations of the angle of divergence "α" mentioned above, angle of divergence decreases when the focal length "f" increases or the distance "h" decreases.

As first measures, the coupling lens 17 whose focal length "f" is large may be used to increase the distance (=f) between the light-emitting unit 13A and the coupling lens 17.

As second measures, the distance "h" may be decreased. The size of the light-emitting unit 13A is determined by the standard of a light emitting element (i.e., 0.2 mm*0.2 mm in the assumption described above).

In other words, it is theoretically possible that a light-emitting unit of smaller size is used in the light emitting element that serves as an inspection element, but the size of a light-emitting unit is subject to restrictions such as the standard of a light emitting element.

In order to decrease the distance "h" when an SMD LED with a light-emitting unit of "0.2 mm*0.2 mm" size is used as the light emitting element 13, an aperture that stops down the laser-beam bundle emitted from the light emitting element 13 to a light receiving element may be used.

Figures 5A, 5B:
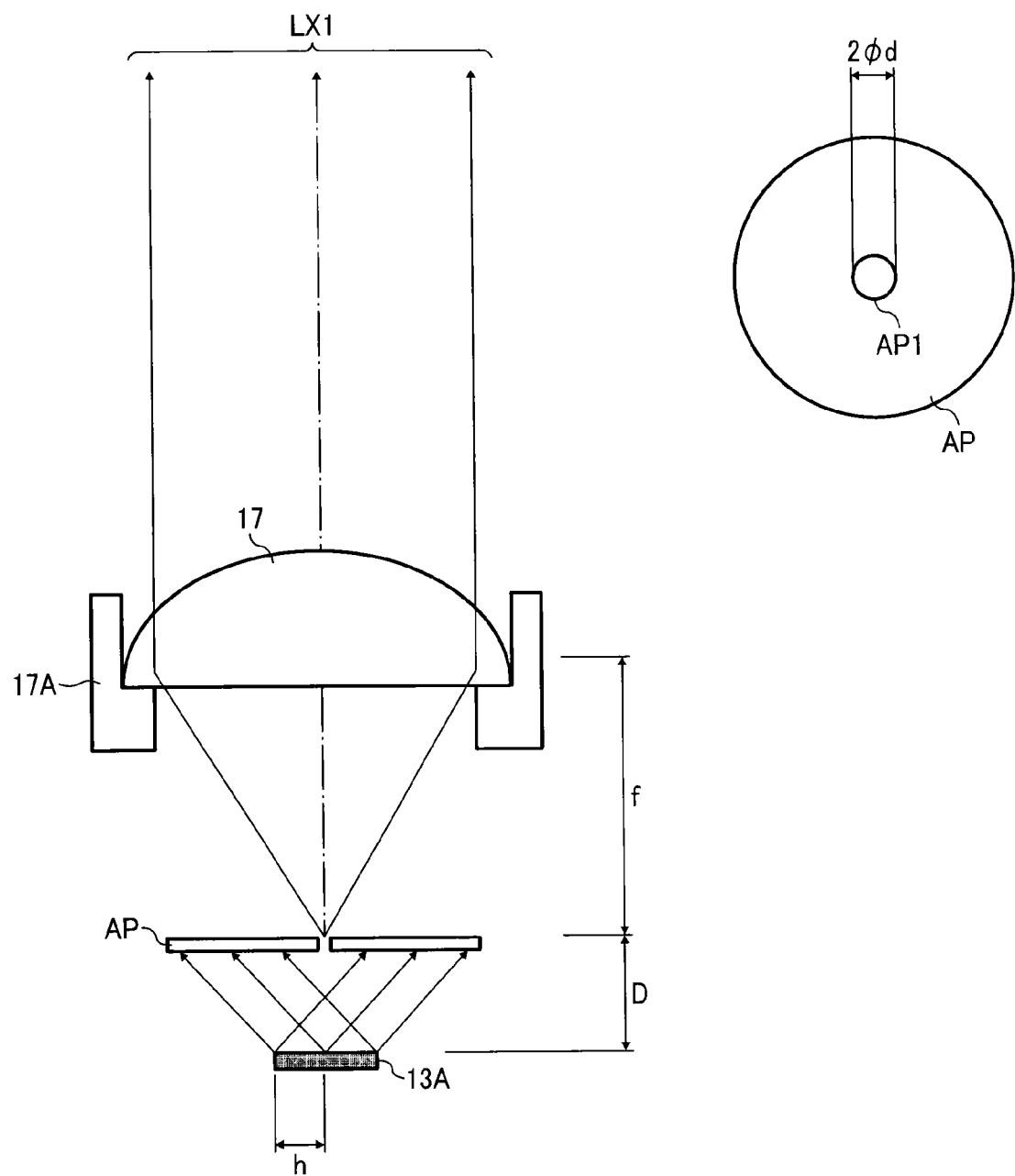
FIGS. 5A and 5B are schematic diagrams of the mechanism of reducing the dispersion of a laser-beam bundle, according to an example embodiment of the present invention.

FIGS. 5A and 5B are schematic diagrams of the mechanism of reducing the dispersion of a laser-beam bundle, according to the present example embodiment. In FIG. 5A, an aperture AP is arranged between the coupling lens 17 and the light-emitting unit 13A of the light emitting element 13.

As illustrated in FIG. 5B, the aperture AP is a disc-like light-shielding member whose effective lens diameter is approximately equal to that of the coupling lens 17, and has a circular aperture AP1 at the center with the aperture diameter of 2φd.

Moreover, as illustrated in FIG. 5A, the aperture AP is arranged so as to be orthogonal to the optical axis of the coupling lens 17 and such that the center of the aperture AP1 is positioned at a focal point of the coupling lens 17 on the object side.

As described above with reference to FIG. 4, it is assumed that the coupling lens 17 has a focal length "f" on the object side.

Accordingly, the angle of divergence "α" of the light that is emitted from the aperture AP1 is calculated as follows.

$$\alpha = \tan^{-1}(\phi d/2f)$$

Accordingly, when "φd<h" is satisfied in the order of the aperture diameter "2φd" to the distance "h" that is proportionate to the size of the light-emitting unit, the divergence (dispersion) of a laser-beam bundle that is emitted from the coupling lens 17 to the to-be-inspected element may be reduced.

As φd is made smaller while "φd<h" is satisfied, the reduction in divergence becomes greater. In view of the reduction in divergence, the aperture AP1 is ideally a pinhole. However, when "φd" that corresponds to the aperture diameter is small, the light quantity of a laser-beam bundle that is used for inspection, which passes through the aperture AP1 of the aperture AP, also becomes small.

As illustrated in FIG. 5A, assuming that the distance between the aperture AP and the light-emitting unit 13A is "D", the light quantity of a laser-beam bundle that is used for inspection may be increased by reducing the distance "D".

In other words, in view of the light quantity, it is desired that the aperture AP be arranged so as to be as close to the light-emitting surface of the light-emitting unit 13A as much as possible.

In order to deal with the reduction in the light quantity of a laser-beam bundle that is used for inspection, which is due to the use of the aperture AP, the transmittance of the ND filter 19 may be increased, or the ND filter 19 may be omitted.

When the light emitting element that servers as an inspection element is mounted on the PWB 15, the position of the light-emitting unit 13A may become misaligned from a specified position due to, for example, an error in assembling.

Such a misalignment occurs in a three-dimensional manner. When the light emitting element 13 in which the light-emitting unit 13A is misaligned due to error in assembling or the like is mounted on the PWB 15, the position of the light-emitting unit 13A may be misaligned from the optical axis or the focal point on the object side in the optical axis of the coupling lens 17.

When the position of the light emitting element 13 is misaligned from a specified position in the example embodiment illustrated in FIG. 1, the position of the light-emitting unit 13A needs to be adjusted to the focal point of the coupling lens 17 on the object side.

When the aperture AP is used as in the example embodiment described above with reference to FIG. 5, it is easy to match the center of the aperture AP1 to the focal point of the coupling lens 17 on the object side. If the aperture AP1 is determined accordingly, allowance is given to the position of the light-emitting unit 13A.

According to such allowance, the position of the light-emitting unit 13A becomes easily adjustable with reference to the coupling lens 17, and the manufacturing of inspection devices also becomes easier.

As described above with reference to FIG. 1, the lid 20 is fixed to the housing 10 by a some sort of engaging unit when the to-be-inspected element 30 is inspected.

In the engagement/disengagement of the lid and housing, a known method is conventionally used to fixedly engage a lid and a housing while the lid is closed.

Figure 6:
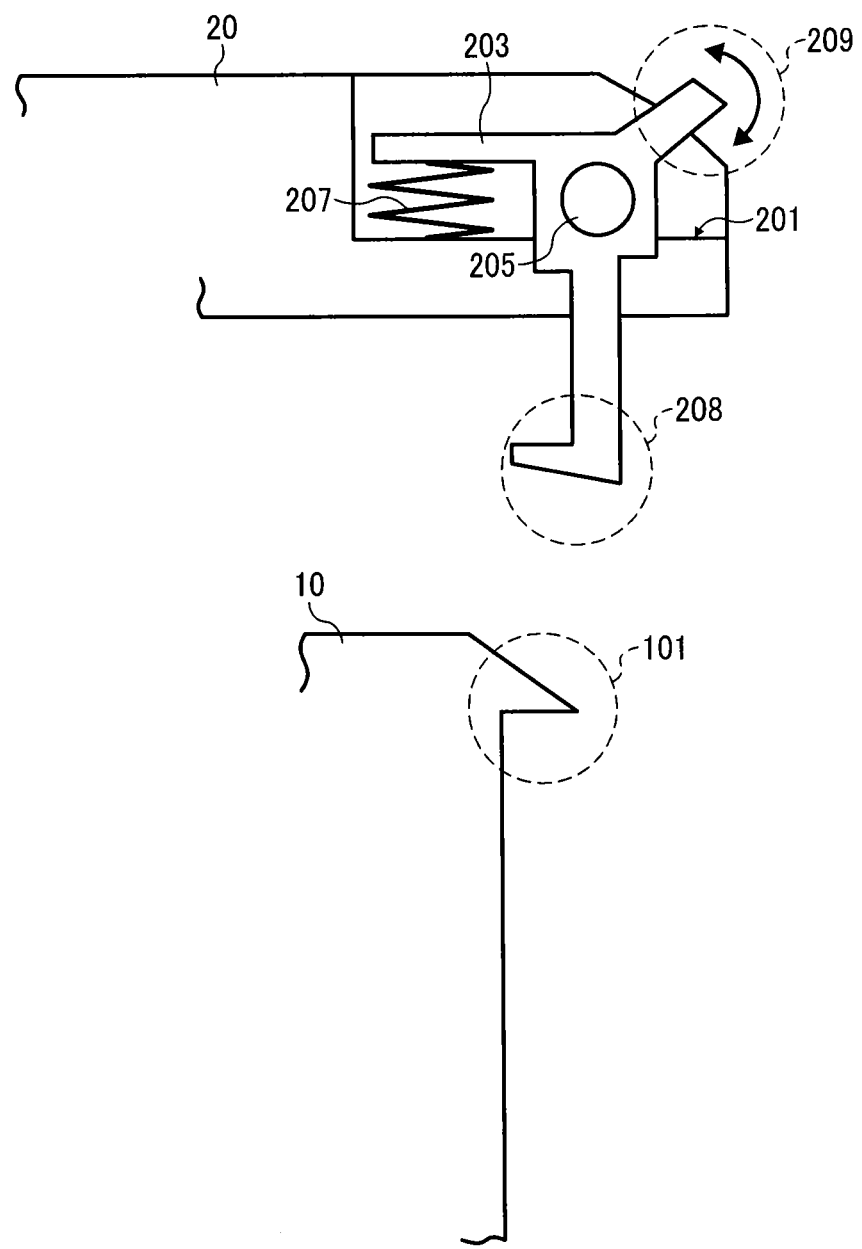
FIG. 6 illustrates an example of the engagement between a housing and a lid according to an example embodiment of the present invention.

FIG. 6 illustrates an example of the engagement between a housing and a lid according to an example embodiment of the present invention. For the purposes of simplification, the housing and the lid are indicated by the reference signs 10 and 20, respectively, in accordance with FIG. 1.

As illustrated in FIG. 6, a cutout portion 201 is formed at a circumferential edge of the lid 20, and an engaging member 203 is attached to the cutout portion 201 in a rockable manner around an axis 205.

A spring 207 is arranged between the brachial portion of the engaging member 203 that extends to the left and the bottom of the cutout portion 201, such that the repulsive force due to the compressibility of the spring 207 applies rotational power to the engaging member 203 in a clockwise direction in FIG. 6.

As illustrated in FIG. 6, the engaging member 203 includes a latch 208 and an operating part 209.

At an outer edge of the housing 10 that touches and detaches from the lid 20, a catch 10 is formed.

In order to fix the lid 20 to the housing 10, the operating part 209 of the engaging member 203 is manipulated by exerting a force thereon to rotate in a counterclockwise direction against the repulsive force of the spring 207.

Upon moving the latch 208 to the right of FIG. 6 as rotated, the lid 20 is placed onto the housing 10 so as to be closed.

Then, the force that is exerted on the operating part 209 is released, and the engaging member 203 rotates in a clockwise direction due to the repulsive force of the spring 207.

As a result, the latch 208 and the catch 101 are engaged, and the lid 20 is fixed to the housing 10.

By using two or more fixation mechanisms composed of the engaging member 203, the spring 207, and the catch 101 as described above, it becomes possible to fix the lid 20 to the housing in a stable manner.

In order to detach the lid 20 from the housing 10, the operating part 209 of the engaging member 203 is manipulated by exerting a force thereon to rotate in a counterclockwise direction.

Upon releasing the engagement between the latch 208 and the catch 101 as rotated, the lid 20 is detached from the housing 10.

As described above, an inspection device as given below can be realized according to one aspect of the present invention.

[1]
An inspection device includes a light emitting element configured to emit light, a light receiving element configured to receive the light, a housing 10 configured to accommodate an inspection element, and a lid 20 configured to be detachable from the housing, where one of the light emitting element and the light receiving element is used as a to-be-inspected element, and the other one is used as an inspection element, the to-be-inspected element and the inspection element are arranged so as to be opposed to each other and the to-be-inspected element is inspected thereby, one of the housing and the lid is provided with an arrangement unit 18 to which the to-be-inspected element is set in a detachable manner, and the lid 20 includes the contact units 21 and 23 that electrically contact the to-be-inspected element by touching and detaching from the to-be-inspected element.

[2]
The inspection device according to [1], where when the housing 10 is installed with the lid 20 and the to-be-inspected element and the inspection element are arranged so as to be opposed to each other, space between the to-be-inspected element and the inspection element is shielded from extraneous light by the lid 20 and the housing 10.

[3]
The inspection device according to any one of [1] and [2], further includes the coupling lens 17 configured to couple the light emitted from the light emitting element 13 and output to the light receiving element 30 side.

[4]
The inspection device according to any one of [1] to [3], further includes the ND filter 19 configured to adjust light intensity of the light received by the light receiving element 30.

[5]
The inspection device according to any one of [1] to [4], further includes the aperture AP configured to stop down a laser-beam bundle emitted from the light emitting element to the light receiving element.

[6]
The inspection device according to any one of [1] to [5], further includes the coupling lens 17 configured to couple the light emitted from the light emitting element and output to the light receiving element side, where the coupling lens collimates a laser-beam bundle that heads for the light receiving element 30.

In the inspection device according to the example embodiments of the present invention as described above, one of the light emitting element and the light receiving element is used as a to-be-inspected element and the other one is used as an inspection element, and the to-be-inspected element is inspected.

The inspection element is used to inspect a to-be-inspected element.

In other words, desired one of the light receiving element and the light emitting element can be inspected.

The inspection element is accommodated in a housing, and the to-be-inspected element is set to the housing or a lid. The to-be-inspected element is detachable, and is detached and attached for every inspection.

When inspection is performed, the to-be-inspected element and the inspection element are arranged so as to be opposed to each other. More specifically, the photo-sensing surface of the light receiving element is opposed to the light-emitting surface of the light emitting element.

The lid includes a contact unit that electrically contacts the to-be-inspected element by touching and detaching from the to-be-inspected element. Moreover, the lid is detachable from the housing.

When the lid to which the to-be-inspected element has been set is attached to the housing, the to-be-inspected element and the inspection element are automatically opposed to each other and become ready for inspection. At the same time, the to-be-inspected element and the inspection element electrically contact with each other.

Accordingly, more efficient inspection is achieved.

The present invention is not limited to the details of the example embodiments described above, and various modifications and improvements are possible. The housing was described as a tubular body in the example embodiments described above, but the shape of the housing may be, for example, cylindrical or angularly cylindrical.

In the description above, it was assumed that the aperture AP is a disc-like light-shielding member whose effective lens diameter is approximately equal to that of the coupling lens 17. However, the shape of the aperture AP is not limited to a circular shape, and the effective lens diameter of the aperture AP may be different from that of the coupling lens 17.

Numerous additional modifications and variations are possible in light of the above teachings. It is therefore to be understood that within the scope of the appended claims, the disclosure of the present invention may be practiced otherwise than as specifically described herein. For example, elements and/or features of different illustrative embodiments may be combined with each other and/or substituted for each other within the scope of this disclosure and appended claims.

What is claimed is:

1. An inspection device, comprising:
   a light emitter that emits light;
   a light sensor that faces the light emitter and receives the light, wherein one of the light emitter and the light sensor is a to-be-inspected element, and the other one of the light emitter and the light sensor is an inspection element that inspects the to-be-inspected element;
   a housing including a tubular body that accommodates the inspection element in a detachable manner; and
   a lid that is detachable from the housing, wherein
   the lid includes an electrical contact that electrically contacts the to-be-inspected element by touching and detaching from the to-be-inspected element.

2. The inspection device according to claim 1, wherein when the lid is attached to the housing so that the to-be-inspected element and the inspection element are opposed to each other, a space between the to-be-inspected element and the inspection element is shielded from extraneous light by the lid and the housing.

3. The inspection device according to claim 2, further comprising:
   a collimating lens that collimates the light emitted from the light emitter and outputs the light to the light sensor.

4. The inspection device according to claim 2, further comprising:
   a neutral-density (ND) filter that adjusts a light intensity of the light received by the light sensor.

5. The inspection device according to claim 2, further comprising:
   a collimating lens that collimates the light emitted from the light emitter and outputs the light to the light sensor; and
   a neutral-density (ND) filter that adjusts a light intensity of the light received by the light sensor.

6. The inspection device according to claim 2, further comprising:
   a light shield including an aperture, the light shield stopping down a laser-beam bundle emitted from the light emitter to the light sensor.

7. The inspection device according to claim 2, further comprising:
   a collimating lens that collimates the light emitted from the light emitter and outputs the light to the light sensor; and
   a light shield including an aperture, the light shield stopping down a laser-beam bundle emitted from the light emitter to the light sensor.

8. The inspection device according to claim 2, further comprising:
   a neutral-density (ND) filter that adjusts a light intensity of the light received by the light sensor; and
   a light shield including an aperture, the light shield stopping down a laser-beam bundle emitted from the light emitter to the light sensor.

9. The inspection device according to claim 2, further comprising:
   a collimating lens that collimates the light emitted from the light emitter and outputs the light to the light sensor;
   a neutral-density (ND) filter that adjusts a light intensity of the light received by the light sensor; and
   a light shield including an aperture, the light shield stopping down a laser-beam bundle emitted from the light emitter to the light sensor.

10. The inspection device according to claim 2, further comprising:
    a collimating lens that collimates the light emitted from the light emitter and outputs the light to the light sensor, wherein
    the collimating lens collimates a laser-beam bundle that heads for the light sensor.

11. The inspection device according to claim 2, further comprising:
    a collimating lens that collimates the light emitted from the light emitter and outputs the light to the light sensor;
    a neutral-density (ND) filter that adjusts a light intensity of the light received by the light sensor; and
    a light shield including an aperture, the light shield stopping down a laser-beam bundle emitted from the light emitter to the light sensor,
    wherein
    the collimating lens collimates a laser-beam bundle that heads for the light sensor.

12. The inspection device according to claim 1, further comprising:
    a collimating lens that collimates the light emitted from the light emitter and outputs the light to the light sensor.

13. The inspection device according to claim 1, further comprising:
    a neutral-density (ND) filter that adjusts a light intensity of the light received by the light sensor.

14. The inspection device according to claim 1, further comprising:
    a light shield including an aperture, the light shield stopping down a laser-beam bundle emitted from the light emitter to the light sensor.

15. The inspection device according to claim 1, further comprising:
    a collimating lens that collimates the light emitted from the light emitter and outputs the light to the light sensor; and
    a light shield including an aperture, the light shield stopping down a laser-beam bundle emitted from the light emitter to the light sensor.

16. The inspection device according to claim 1, further comprising:
    a neutral-density (ND) filter that adjusts a light intensity of the light received by the light sensor; and a light shield including an aperture, the light shield stopping down a laser-beam bundle emitted from the light emitter to the light sensor.

17. The inspection device according to claim 1, further comprising:
  a collimating lens that collimates the light emitted from the light emitter and outputs the light to the light sensor;
  a neutral-density (ND) filter that adjusts a light intensity of the light received by the light sensor; and
  a light shield including an aperture, the light shield stopping down a laser-beam bundle emitted from the light emitter to the light sensor.

18. The inspection device according to claim 1, further comprising:
  a collimating lens that collimates the light emitted from the light emitter and outputs the light to the light sensor, wherein
  the collimating lens collimates a laser-beam bundle that heads for the light sensor.

19. The inspection device according to claim 1, further comprising:
  a light shield including an aperture, the light shield stopping down a laser-beam bundle emitted from the light emitter to the light sensor; and
  a collimating lens that collimates the light emitted from the light emitter and outputs the light to the light sensor, wherein
  the collimating lens collimates a laser-beam bundle that heads for the light sensor.

20. The inspection device according to claim 1, further comprising:
  a neutral-density (ND) filter that adjusts a light intensity of the light received by the light sensor; and
  a collimating lens that collimates the light emitted from the light emitter and outputs the light to the light sensor, wherein
  the collimating lens collimates a laser-beam bundle that heads for the light sensor.

* * * * *